United States Patent [19]

Smayling et al.

[11] Patent Number: 5,681,768
[45] Date of Patent: Oct. 28, 1997

[54] TRANSISTOR HAVING REDUCED HOT CARRIER IMPLANTATION

[75] Inventors: Michael C. Smayling, Missouri City, Tex.; David A. Baglee, Albuquerque, N. Mex.

[73] Assignee: Texas Instruments Incorporated, Dallas, Tex.

[21] Appl. No.: 482,329

[22] Filed: Jun. 7, 1995

Related U.S. Application Data

[62] Division of Ser. No. 472,911, Jan. 31, 1990.

[51] Int. Cl.$^6$ ............................................. H01L 21/265
[52] U.S. Cl. ........................... 437/41; 437/979; 437/983
[58] Field of Search .............................. 437/29, 405 W, 437/40 GS, 41 SW, 41 GS, 979, 983, 985, 44, 101; 148/DIG. 163

[56] References Cited

U.S. PATENT DOCUMENTS

| | | | |
|---|---|---|---|
| 3,339,128 | 8/1967 | Olmstead et al. | 317/235 |
| 3,719,866 | 3/1973 | Naber et al. | 317/235 R |
| 3,832,248 | 8/1974 | Bazin et al. | |
| 3,920,481 | 11/1975 | Hu | 437/979 |
| 4,238,758 | 12/1980 | Suzuki | 357/23.15 |
| 4,313,256 | 2/1982 | Widmann | 29/579 |
| 4,520,553 | 6/1985 | Kraft | 437/979 |
| 4,610,078 | 9/1986 | Matsukawa et al. | 29/576 |
| 4,677,739 | 7/1987 | Doering et al. | 357/91 |
| 4,866,491 | 9/1989 | Solomon | 357/23.15 |
| 4,886,764 | 12/1989 | Miller et al. | 437/983 |
| 4,931,408 | 6/1990 | Hshieh | 437/44 |
| 4,954,867 | 9/1990 | Hosaka | 357/52 |
| 4,956,311 | 9/1990 | Liou et al. | 437/44 |
| 5,091,334 | 2/1992 | Yamazaki et al. | 437/101 |

FOREIGN PATENT DOCUMENTS

| | | | |
|---|---|---|---|
| 60-34068 A | 2/1985 | Japan | 437/983 |
| 2-66948 A | 3/1990 | Japan | 437/53 |
| 2 062 959 | 5/1981 | United Kingdom | 437/983 |

OTHER PUBLICATIONS

Cleavelin, et al. "A 5-Volt Contactless Array 256Kbit Flash EEPROM Technology", *IEEE* 1988, pp. 428–431.

*Primary Examiner*—John Niebling
*Assistant Examiner*—Brian K. Dutton
*Attorney, Agent, or Firm*—Ronald O. Neerings; James C. Kesterson; Richard L. Donaldson

[57] ABSTRACT

A transistor having reduced hot carrier implantation is disclosed which is formed on an outer surface (12) of a semiconductor substrate (10). The transistor comprises a source region (22) and a drain region (24) which define there between a channel region (34). A gate insulator layer (14) insulates a gate conductor (16) from the channel region (34). A sidewall insulator body (20) is formed such that a thickened region of insulator separates an end of gate conductor (16) from a portion of channel region (34) proximate drain region (24). This thickened insulator reduces the local electric field in channel region (34) near drain region (24) and correspondingly reduces the implantation into gate insulator (14) of hot carriers generated from impact ionization.

28 Claims, 3 Drawing Sheets

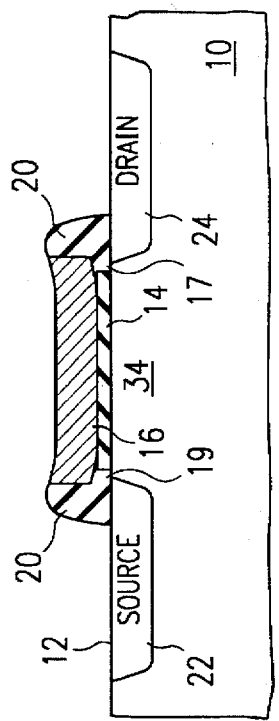
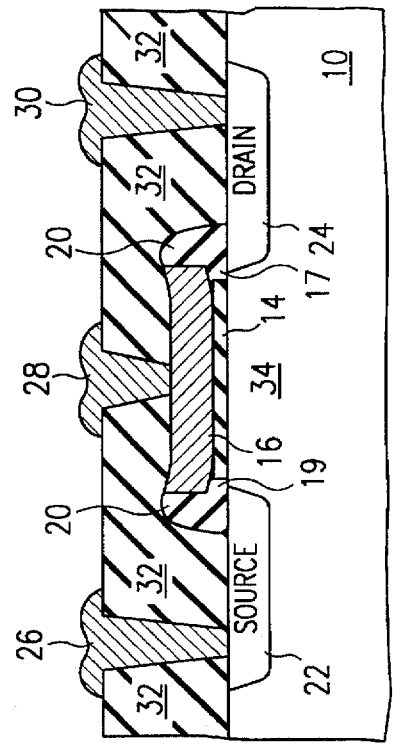
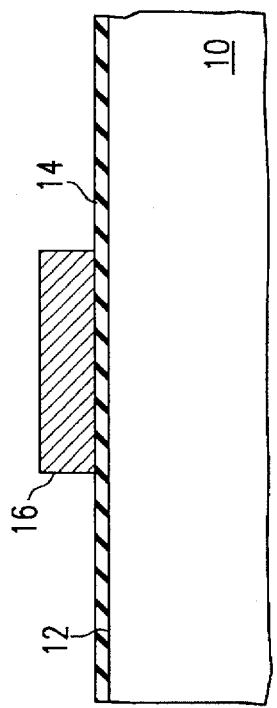
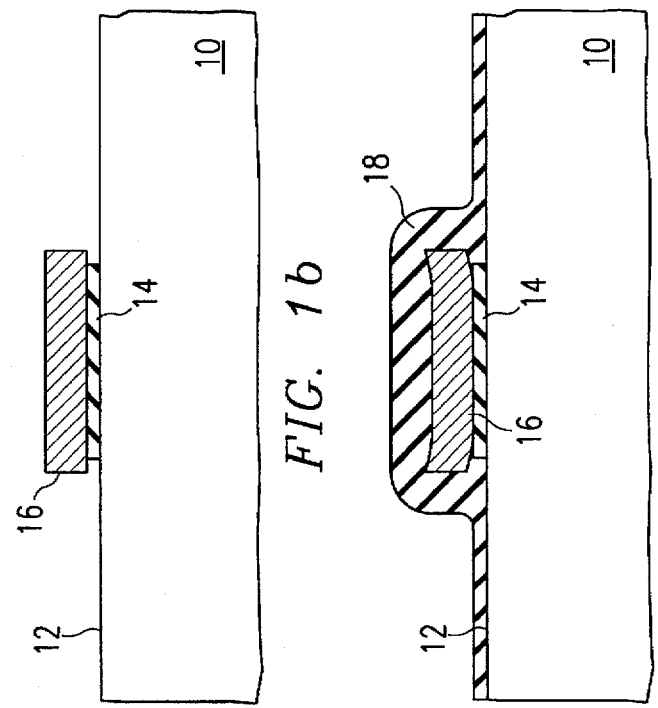

TRANSISTOR HAVING REDUCED HOT CARRIER IMPLANTATION

This is a divisional application under 37 CFR 1.60, of pending prior application Ser. No. 07/472,911 filed on Jan. 31, 1990.

TECHNICAL FIELD OF THE INVENTION

This invention relates, in general, to the field of electronic integrated circuits, and more specifically, to a transistor having reduced hot carrier implantation and method performing the same.

BACKGROUND OF THE INVENTION

The field effect transistor forms the building block of many modern digital integrated electronic devices. However, a strong electric field across the gate of a field effect transistor can result in the degradation of the performance of the device. This problem arises whenever carriers in the substrate current collide with the crystal lattice of the channel of the device causing impact ionization. The strong gate-channel electric field attracts these sprayed carriers which are caused from impact ionization. These carriers which become sprayed due to impact ionization are referred to as "hot carriers" and may comprise either electrons or holes depending on the conductivity the of the device. This electric field across the gate often causes these hot carriers to become injected into the gate oxide, resulting in the degradation of the device due to the increased charge trapped in the gate oxide. One way to prevent this degradation of the device associated with hot carriers is to reduce the electric field across the gate oxide.

In prior art systems, the method of reducing this degradation associated with hot carriers was to only lightly dope the drain with impurities. This lightly doped drain increases the length of the channel region and decreases the electric field. However, this method also has the negative effect of slowing the operational speed of the device.

Accordingly, a need has arisen for a transistor architecture which substantially reduces problems associated with hot carriers which does not substantially affect the performance of the device.

SUMMARY OF THE INVENTION

In accordance with the present invention, a transistor is provided which substantially reduces problems associated with the degradation effects of hot carriers. More specifically, the present invention discloses a transistor having reduced hot carrier implantation which is formed in an outer surface of a semiconductor layer. Source and drain regions are formed in the outer surface, defining a channel region therebetween. A gate conductor is formed outwardly and insulatively disposed from the channel region. An end region of the gate insulator adjacent to the source region is distended so as to reduce the local electric field and correspondingly reduces the number of hot carriers implanted into the gate insulator.

An important technical advantage of the transistor of the present invention is the substantial elimination of problems associated with hot carriers. Due to the distended end region of the gate insulator adjacent to the drain region, the implantation of hot carriers into the gate insulator is reduced as a result of the reduced local electric field.

A further technical advantage of the transistor of the present invention inheres in the fact that the step of forming source/drain regions is self-aligned with the edges of the gate conductor. This self-aligned feature prevents an overlap between the gate conductor and the source/drain regions and thereby enhances the operation of the device.

BRIEF DESCRIPTION OF THE DRAWINGS

A more complete understanding of the present invention may be acquired by referring to the detailed description and claims when considered in connection with the accompanied drawings in which like reference numbers indicate like features and wherein:

FIGS. 1a–1e are cross-sectional elevational diagrams which illustrate a method of constructing a transistor according to a first embodiment of the present invention.

DETAILED DESCRIPTION OF THE INVENTION

Figure 2A:
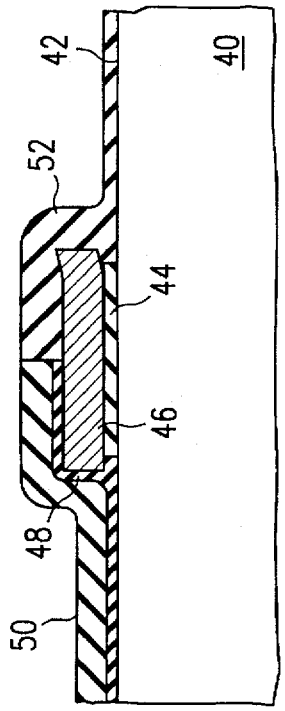
FIGS. 2a–2f are cross-sectional elevational diagrams which illustrate a method of constructing a transistor according to second embodiment of the present invention.

Degradation of any transistor can result when hot carriers are absorbed into the gate insulator. These carriers may comprise hot electrons or hot holes depending on the conductivity type of a particular device. The present invention will be described with reference to electrons but it should be understood that the present invention is also applicable to transistor architectures where hot holes causes degradation of the device. During the operation of a field effect transistor, electrons in the channel current may impact other atoms causing hot electrons to spray according to an effect known as impact ionization. These hot electrons are attracted to the gate due to the gate-channel electric field pointed toward the gate. Many of these hot electrons become implanted into the gate insulator resulting in the degradation of the device.

Referring to FIG. 1, a self-aligned process is illustrated which shows a series of process steps used to construct a transistor according to the teachings of the present invention which substantially reduces the aforementioned degradation due to hot electrons by reducing the strength of the electric field at the end of the channel proximate the drain of the device.

Referring to FIG. 1a, a semiconductor substrate 10 is shown having an outer surface 12. Gate insulator layer 14 is formed on outer surface 12. Gate insulator layer 14 may comprise, for example, silicon dioxide which may be thermally grown or deposited on outer layer 12 to a thickness on the order of 200–400 Angstroms. A gate conductor 16 is then formed outwardly from gate insulator layer 14 using known techniques which my comprise steps of deposition, doping, patterning and etching. For example, polycrystalline or amorphous semiconductor material may be deposited outwardly from gate insulator region 14 to a thickness on the order of 4,000 Angstroms. This semiconductor material may then be doped by the implantation of a sufficient number of ions to render gate conductor 16 conductive. The conductive semiconductor layer is then patterned and etched using known photolithographic techniques to form gate conductor 16 shown in FIG. 1a. The etchant step used to form gate conductor 16 may, for example, use a chlorine-based etchant having selectivity to oxide on the order of 50:1.

Referring to FIG. 1b, an isotropic etch step is used to remove portions of gate insulator layer 14 and slightly undercut gate conductor 16, as shown in FIG. 1b. The etchant used in this isotropic etchant step may be, for example, hydrofluoric acid, which is selective to silicon.

Referring to FIG. 1c, an insulator layer 18 is formed on outer surface 12 and outwardly from gate conductor 16. Insulator layer 18 may be grown according to known methods to a depth on the order of 200 Angstroms thick outwardly from outer surface 12 and to a depth on the order of 1000 Angstroms thick outwardly from gate conductor 16. Using known methods, insulator layer 18 may be grown such that it grows faster over areas having a high dopant concentration to provide for the difference in thickness between the regions of layer 18 proximate gate conductor 16 and the remainder of outer surface 12. Insulator layer 18 may comprise, for example, an oxide material such as silicon dioxide, and may be grown, for example, using steam at a temperature on the order of 800–900 degrees celsius. It should be noted that due to the slight undercutting at the opposite ends of gate conductor 16, the growth of the insulator layer 18 between the gate conductor 16 and the outer surface 12 at each of the opposite ends causes a slight outward deformation of the opposite ends of gate conductor 16 into a "smile" configuration resulting in thickened portions 17 and 19 of insulative material separating the gate conductor 16 from outer surface 12 at opposite ends of gate conductor 16.

Referring to FIG. 1d, an anisotropic etch step is used to remove portions of insulating layer 18. The etchant used in this anisotropic etch step may be, for example, selective to silicon. Sidewall insulator bodies 20, having a width on the order of 2500 Angstroms, are left partially surrounding gate conductor 16, as shown in FIG. 1d. A source region 22 and a drain region 24 may then be formed according to known methods by the implantation of a sufficient number of ions to render regions conductive. For example, if substrate 10 is an N type substrate, a sufficient implantation of boron ions will render regions 22 and 24 conductive. Conversely, if substrate 10 is a P type substrate, a sufficient implantation of phosphorous ions will render regions 22 and 24 conductive. The ion implantation step is self-aligned due to the pre-existing gate conductor 16. Source region 22 and drain region 24 may be implanted substantially adjacent to sidewall spacers 20 and may then be subjected to an annealing step to allow for controlled migration of the implanted dopants under sidewall spacers 20 until they define between themselves a channel region 34 in substrate 10 disposed inwardly from gate conductor 16. This anneal step may be, for example, on the order of 950 degrees celsius for 60 minutes to provide the necessary diffusion of the implanted ions. It should be understood that the identification of source region 22 and drain region 26, as such, are solely for convenience in the teaching of the present invention. Where appropriate, the transistor of the present invention may be constructed as an electrically symmetrical device allowing current flow in either direction.

Referring to FIG. 1e, an isolation insulator layer 32 is conformally deposited covering the entirety of the transistor architecture. Isolation insulator 32 may comprise, for example, conformally deposited silicon dioxide. The outer surface of the isolation insulator layer 32 may then be patterned and etched using known photolithograhic techniques to form openings exposing the outer surfaces of source region 22, gate conductor 16 and drain region 24. A source contact 26, gate contact 28 and a drain contact 30 are then formed, respectfully, within each of these openings using known photolithographic techniques to provide a conductive contact to each of regions 22 and 24 and conductor 16. Source contact 26, gate contact 28 and drain contact 30 may comprise, for example, a suitable conductor such as aluminum, or polycrystalline or amorphous semiconductor material doped so as to be rendered conductive.

The transistor architecture shown in FIG. 1 of the present invention offers several important technical advantages. First, the ion implantation process step shown in FIG. 1d used to create source 22 and drain 24 regions is self-aligned due to the pre-existing gate conductor 16. This self-aligned feature of the transistor architecture shown in FIG. 1 of the present invention prevents an overlap of source 22 and drain 24 regions with gate conductor 16, and thereby enhances performance of the device. Secondly, due to the increased thickness of the portions of sidewall insulator bodies 20 which are disposed between channel region 34 and gate conductor 16, the capacitance across the gate conductor 16 is reduced which increases the saturation voltage of the device and decreases the electric field. In this manner, problems associated with hot electrons are substantially reduced. The lower electric field reduces the implantation of hot carriers generated through impact ionization and thereby substantially reduces the degradation of the device associated with hot electron implantation into gate insulator layer 14. As discussed previously, it should be understood that the process illustrated by FIGS. 1a–1e is intended to illustrate a generic process shown solely for the purposes of teaching the present invention. For example, while the process illustrated in FIGS. 1a–1e was described with reference to the problems associated with hot electrons, the teachings of the present invention are also applicable to the construction of a transistor to substantially reduce the problems associated with hot holes. Problems associated with hot holes are especially apparent for submicron device geometries.

Constructing a transistor according to the teachings of the present invention as illustrated in FIG. 1 can result in the substantial reduction of the problems associated with hot electrons. However, if a device having an extremely short channel is desired, constructing a transistor according to the embodiment of the present invention as illustrated in FIG. 1 may have the negative effect of increasing the threshold voltage of the device due to the distended region 19 of insulator material separating gate conductor 16 from the portion of channel region 34 proximate source region 22. A higher threshold voltage may degrade performance of the device due to the higher voltage swing necessary to turn the device on. Since no large channel field exists at the source end of the transistor, the thicker region 19 of insulator near source region 22 does not appreciably reduce problems associated with hot electrons. As transistors become shorter, the increase in threshold voltage becomes more apparent due to the increasing percentage of thickened region 19 in proportion to the overall length of the channel region 34. Thus, an alternative process implementing only distended region 17 adjacent to the drain region 24 may be used to prevent problems associated with hot electrons without substantially increasing the threshold voltage of the device for geometries having extremely short channel lengths.

FIG. 2 illustrates an alternative self-aligned process for constructing a transistor according to the teachings of the present invention whereby the problems associated with hot electrons are substantially eliminated and an increase in threshold voltage is prevented. It should be understood that the process steps shown in FIG. 2 are directed at solving problems associated with hot electrons, but the teachings of the present invention as illustrated in FIG. 2 may also be applied to solve problems associated with hot holes.

Figure 2B:
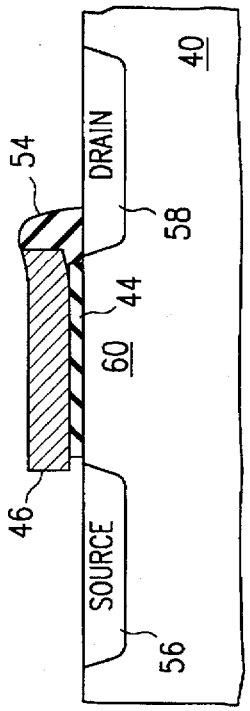

The process steps shown in FIGS. 2a and 2b are identical to those shown in FIGS. 1a and 1b, respectively. These process steps result in the formation of a gate conductor 46 separated from an outer surface 42 of a semiconductor substrate 40 by a gate insulator layer 44 as shown in FIG. 2b.

Figure 2C:
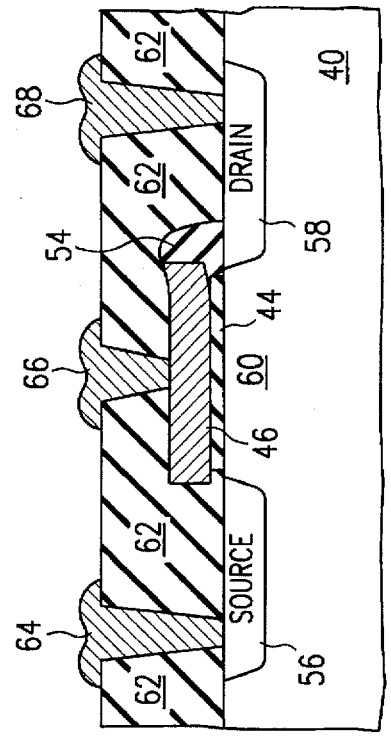

Referring to FIG. 2c, a buffer insulator layer 48 is formed outwardly from a portion of outer surface 42 and outwardly from a portion of gate conductor 46 as shown. Buffer insulator layer 48 may comprise, for example, silicon dioxide which may be thermally grown or deposited to a thickness on the order of 500 Angstroms. Next, a mask layer 50 is formed outwardly from buffer insulator layer 48, as shown in FIG. 2c. Mask layer 50 may be formed by depositing, patterning and etching a layer of, for example, silicon nitride.

Figure 2D:
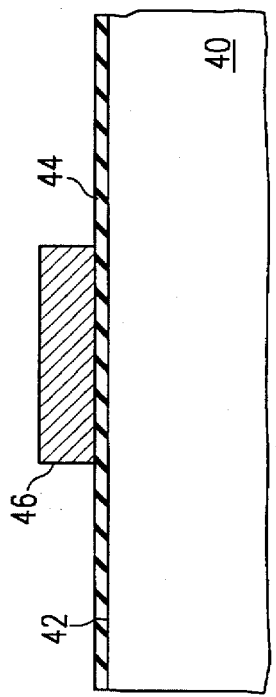

Referring to FIG. 2d, an insulator layer 52 is formed on the portion of outer surface 42 and outwardly from gate conductor 46. Insulator layer 52 may be grown according to well known methods to a depth on the order 200 Angstroms thick outwardly from outer surface 42 and to a depth on the order of 1000 Angstroms thick outwardly from gate conductor 46. Insulator layer 52 may comprise, for example, an oxide material such as silicon dioxide and may be grown, for example, using steam at a temperature on the order of 800–900 degrees celsius such that regions of layer 52 proximate gate conductor 46 grow more rapidly due to the higher dopant concentration than regions proximate outer surface 42. In this manner, gate conductor 46 is caused to deform into the "smile" configuration discussed previously only at one end while the opposite end of gate conductor 46 remains unchanged. This results in a distended region 53 separating gate conductor 46 from outer surface 42.

Figure 2E:
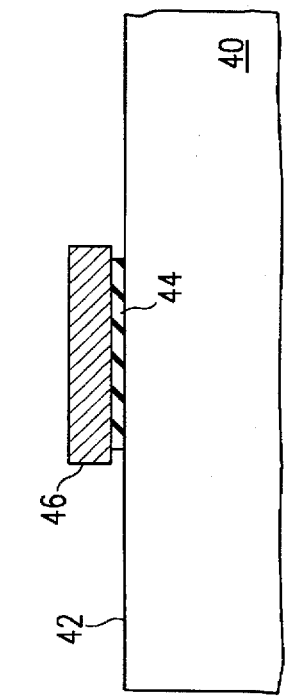

Referring to FIG. 2e, mask layer 50 is removed using an etchant process which may be, for example, selective to oxide. Next, an anisotropic etchant step is used to remove buffer insulator layer 48 and portions of insulator layer 52 which may be, for example, selective to silicon. This anisotropic etchant step results in the formation of sidewall insulator body 54, having a width on the order of 2,500 Angstroms, which is left partially surrounding gate conductor 46, as shown in FIG. 2e.

A source region 56 and a drain region 58 may then be formed according to known methods by the implantation of a sufficient number of ions to render these regions conductive. For example, if substrate 40 is an N type substrate, a sufficient implantation of boron ions will render these regions conductive. Conversely, if substrate 40 is a P type substrate, a sufficient implantation of phosphorous ions will render regions 56 and 58 conductive. The ion implantation step used to form regions 56 and 58 is self-aligned due to the pre-existing gate conductor 46. An anneal step on the order of 950 degrees celsius for 60 minutes may then be used to provide for the controlled migration of the implanted ions such that source region 56 and drain region 58 define, between themselves, a channel region 60 in substrate 40 disposed inwardly from gate conductor 46.

It should be understood that the identification of source region 56 and drain region 58, as such, are solely for convenience in the teaching of the present invention. Where appropriate, the transistor of the present invention may be constructed as an electrically symmetrical device allowing current flow in either direction.

Figure 2F:
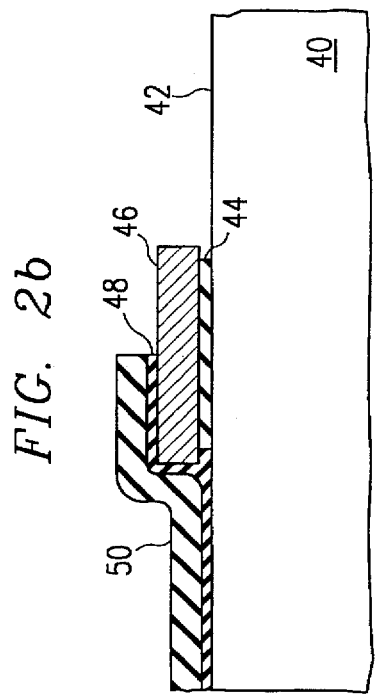

Referring to FIG. 2f, an isolation insulator layer 62 is conformally deposited covering the entirety of the transistor architecture. Isolation insulator 62 may comprise, for example, conformally deposited silicon dioxide. The outer surface of isolation insulator 62 may then be patterned and etched using known photolithographic techniques to form openings exposing the outer surfaces of source region 56, gate conductor 46 and drain region 58. Source contact 64, gate contact 66 and drain contact 68 may then be formed, respectfully, within each of these openings from conductive material which is deposited, patterned and etched using known techniques. Source contact 64, gate contact 66 and drain contact 68 may comprise, for example, a suitable conductor such as aluminum, or polycrystalline or amorphous semiconductor material doped so as to be rendered conductive. The completed transistor architecture shown in FIG. 2f illustrates an alternative embodiment of the transistor of the present invention having several important technical advantages. First, the ion implantation process step shown in FIG. 2e used to create source region 56 and drain region 58 is self-aligned due to the pre-existing gate conductor 46. This self-aligned feature of the transistor architecture prevents the overlap of drain region 58 with gate conductor 46, and thereby enhances performance of the device. Secondly, due to the sidewall insulator body 54, the device will exhibit a lower electric field and thus reducing impact ionization and substantially preventing the degradation of the device due to hot electrons. Thirdly, using the masking step shown in FIG. 2d, the architecture illustrated in FIG. 2 does not contain a sidewall insulator body adjacent to the source region 56. A sidewall insulator body adjacent to the source region 56 does not reduce problems associated with hot electrons since a large channel field does not exist near the source region 56 of the transistor. A sidewall insulator body adjacent to the source region would only increase the series resistance of the device. The process of implementing a single insulator body 54 as illustrated in FIG. 2 of the present invention substantially eliminates problems associated with hot electrons without appreciably increasing the series resistance of the device.

It should be understood that the process illustrated by FIGS. 2a–2f is shown solely for the purposes of teaching the present invention. For example, while the process illustrated in FIGS. 2a–2f results in the formation of a transistor designed to substantially eliminate problems associated with hot electrons, the teachings of the present invention are also applicable to the construction of a transistor which substantially eliminates the problems associated with hot holes.

Referring to FIG. 3, a process is illustrated for constructing an alternate embodiment of the transistor of the present invention, which substantially reduces the aforementioned degradation due to hot electrons.

Figure 3A:
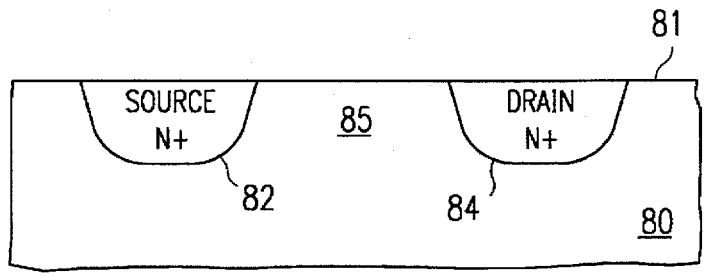
FIGS. 3a–3d are cross-sectional elevational diagrams which illustrate a method of constructing a transistor according to third embodiment of the present invention.

Referring to FIG. 3a, a semiconductor substrate 80 is shown having an outer surface 81. A source region 82 and a drain region 84 are formed in the outer surface 81 of semiconductor substrate 80. Source region 82 and drain region 84 may be formed according to known methods by the implantation of a sufficient number of ions to render these regions conductive. For example, if substrate 80 is a N type substrate, a sufficient implantation of boron ions will render regions 82 and 84 conductive. Conversely, if substrate 80 is a P type substrate, a sufficient implantation of arsenic ions will render regions 82 and 84 conductive. For example, arsenic ions may be implanted to a concentration of $10^6$ ions/cm$^2$ to allow regions 82 and 84 to be conductive. Source region 82 and drain region 84 are formed such that they define between themselves a channel region 85 within substrate 80. It should be understood that the identification of source region 82 and drain region 84 are, as such, presented solely for convenience in the teaching of the present invention. Where appropriate, the transistor of the present invention may be constructed as an electrically symmetrical device allowing current flow in either direction.

Figure 3B:
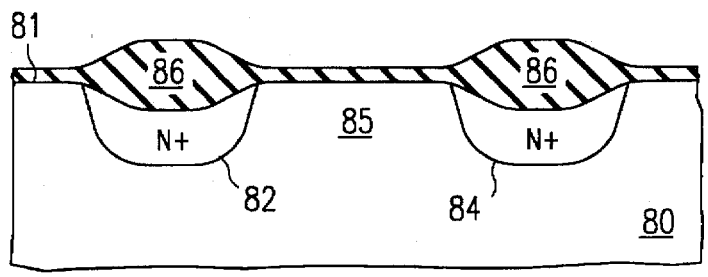

Referring to FIG. 3b, an insulator layer 86 is formed on outer surface 81 of substrate 80. Insulator layer 86 may be grown according to known methods to a depth on the order of 200 Angstroms thick, except where it is adjacent to regions 82 and 84 where it is grown to a depth on the order of 1000 Angstroms thick. Insulator layer 86 may comprise, for example, an oxide material such as silicon dioxide, and may be grown using steam at 800 degrees celsius to provide for a more rapid growth of regions of layer 86 adjacent highly doped areas such as regions 82 and 84.

Figure 3C:
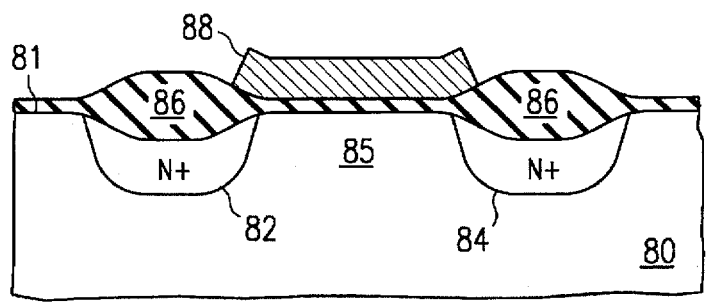

Referring to FIG. 3c, a gate conductor 88 is formed outwardly from insulator layer 86 by depositing, patterning and etching a layer of semiconductor material on insulator layer 86. Gate conductor 88 may comprise, for example, polycrystalline, amorphous, partially recrystallized or recrystallized semiconductor material.

Figure 3D:
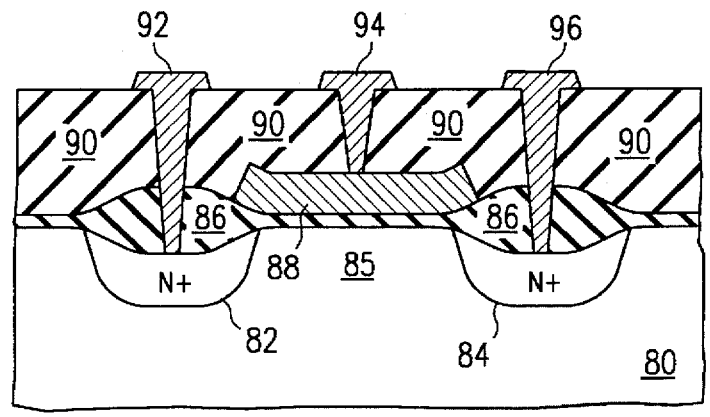

Referring to FIG. 3d, an isolation insulator layer 90 is conformally deposited covering the entirety of the transistor architecture. Isolation insulator 90 may comprise, for example, conformally deposited silicon dioxide. The outer surface of isolation insulator 90 is patterned and etched using known photolithographic techniques to form openings exposing the outer surfaces of source region 82, gate conductor 88 and drain region 84. A source contact 92, a gate contact 94 and a drain contact 96 are then formed, respectfully, within each of these openings using known photolithographic techniques to provide an electrical contact. Source contact 92, gate contact 94 and drain contact 96 may comprise, for example, a suitable conductor such as aluminum, or polycrystalline or amorphous semiconductor material doped so as to be rendered conductive.

The embodiment of the transistor of the present invention shown in FIG. 3 offers several important technical advantages. Due to the distended area of insulator layer 86, the electric field of the device in this region is substantially reduced thereby substantially reducing problems associated with hot electrons. Even though the process shown in FIGS. 3a–3d is not self-aligned, the necessary overlap between regions 82 and 84 and with gate conductor 88 is not a problem due to the sharp outward angle of gate conductor 88 proximate opposite source region 82 and drain region 84. Because of the sharp angle the capacitance between gate conductor 88 and regions 82 and 84 is reduced because of the increased distance between regions 82 and 84 and gate conductor 88. This reduced capacitance lowers the local electric field and reduces problems associated with hot electrons.

It should be understood that the process illustrated by FIGS. 3a–3d is intended to illustrate a generic process shown solely for the purposes of teaching the present invention. For example, while the process illustrated in FIGS. 3a through 3d illustrate the formation of a transistor designed to substantially eliminate problems associated with hot electrons, the teachings of the present invention are equally applicable to the construction of a transistor to substantially eliminate the problems associated with hot holes.

In summary, although the present invention has been described in detail with reference to the particular embodiments as illustrated in FIGS. 1, 2 and 3, it should be understood that various changes, substitutions and alterations may be made hereto without departing from the spirit and scope of the invention as defined by the appended claims.

What is claimed is:

1. A method for constructing a transistor having reduced hot carrier implantation formed in an outer surface of a semiconductor substrate layer, comprising the steps of:

forming a first insulator layer on the outer surface of the semiconductor substrate;

forming a gate conductor on the first insulator layer;

removing the portion of the first insulator layer not covered by the gate conductor and a portion of the first insulator layer covered by the gate conductor and adjacent the periphery of the gate conductor;

after said removing step, forming a second insulator layer on a first portion of the semiconductor substrate and on a first portion of the gate conductor;

forming a third insulator layer on the second insulator layer;

forming a fourth insulator layer on a second portion of the semiconductor substrate and on a second portion of the gate conductor, the fourth insulator layer outwardly deforming the portion of the gate conductor that it is formed on;

after forming said fourth insulator layer, removing said second and third insulator layers and any portion of said fourth insulator layer on top of the gate conductor and removing said fourth insulator layer on the semiconductor substrate spaced a distance from the gate; and after removing the portions of the fourth insulator layer, forming first and second source/drain regions in the outer surface, said first and second source/drain regions being spaced apart to define a channel region therebetween.

2. The method of claim 1 wherein said step of forming first and second source/drain regions comprises the step of:

forming said first and second source/drain regions disposed in the outer surface spaced apart to define said channel region therebetween using a process where the first and second source/drain regions are self-aligned to opposing edges of the gate conductor.

3. The method of claim 1 and further comprising the step of:

forming an isolation insulator layer disposed outwardly from the first and second source/drain regions and the gate conductor.

4. The method of claim 3 and further comprising the step of:

forming a first source/drain contact passing through the insulator region and adjacent and electrically coupled to the first source/drain region;

forming a second source/drain contact passing through the isolation insulator layer and adjacent and electrically coupled to the second source/drain region; and forming a gate contact passing through the isolation insulator layer and adjacent and electrically coupled to the gate conductor.

5. The method of claim 1 wherein said step of forming first and second source drain regions comprises the step of implanting a sufficient quantity of ions into the outer surface so as to render the first and second source/drain regions conductive.

6. The method of claim 1 wherein said first and fourth insulative layers comprise deposited insulative material.

7. The method of claim 1 wherein said first and fourth insulative layers comprise grown insulative material.

8. The method of claim 7 wherein said grown material is silicon dioxide.

9. The method of claim 1 wherein the fourth insulator layer is formed on a second portion of the semiconductor substrate and on a second portion of the gate conductor not covered by the second and third insulator layers.

10. A method for constructing a transistor having reduced hot carrier implantation formed in an outer surface of a semiconductor substrate layer, comprising the steps of:

forming a first insulator layer on the outer surface of the semiconductor substrate layer;

forming a gate conductor on the first insulator layer;

removing the portion of the first insulator layer not covered by the gate conductor and a portion of the first insulator layer covered by the gate conductor and adjacent the periphery of the gate conductor;

after said removing step, forming a second insulator layer further insulating the gate conductor from the outer surface of the semiconductor substrate, the second insulator layer comprising distended end regions disposed between the gate conductor and the outer surface of the semiconductor substrate proximate the periphery of gate conductor of said second insulator layer disposed between the gate, conductor and the outer surface, said distended end regions outwardly deforming opposite ends of the periphery of the gate conductor; and after forming said second insulator layer, forming first and second source/drain regions in the outer surface and adjacent the gate insulator layer, said first and second source/drain regions being spaced apart to define a channel region therebetween.

11. The method of claim 10 wherein said first and second insulator layers form a gate insulator layer.

12. The method of claim 11 wherein said gate insulator layer is formed of deposited insulative material.

13. The method of claim 11 wherein said gate insulator layer is formed of grown insulative material.

14. The method of claim 13 wherein said grown insulative material is silicon dioxide.

15. The method of claim 11 wherein the first insulator layer portion of said gate insulator layer is formed of deposited insulative material and the second insulator layer portion of said gate insulator layer is formed of grown insulative material.

16. The method of claim 11 wherein said steps of forming a gate conductor and forming a gate insulator layer comprises the steps of:

forming a first insulator layer outwardly from the outer surface of the semiconductor substrate;

depositing a layer of conductive material outwardly from the insulative layer;

etching the layer of conductive material and exposing portions of the insulative layer to form a gate conductor body; and forming a second insulator layer outwardly from the outer surface of the substrate and from the gate conductor body resulting in a thickened insulator region disposed between an end portion of the gate conductor and the outer surface of the substrate.

17. The method of claim 10 wherein said step of forming first and second source/drain regions comprises the step of:

forming first and second source/drain regions disposed in the outer surface and spaced apart to define a channel region therebetween using a process where the first and second source/drain regions are self-aligned to opposing edges of the gate conductor.

18. The method of claim 17 and further comprising the step of:

forming an isolation insulator layer disposed outwardly from the first and second source/drain regions and the gate conductor.

19. The method of claim 18 and further comprising the steps of:

forming a first source/drain contact passing through the insulator region and adjacent and electrically coupled to the first source/drain region;

forming a second source/drain contact passing through the isolation insulator layer and adjacent and electrically coupled to the second source/drain region; and forming a gate contact passing through the isolation insulator layer and adjacent and electrically coupled to the gate conductor.

20. The method of claim 17 wherein said step of forming first and second source/drain regions comprises the step of implanting a sufficient quantity of ions into the outer surface so as to render the first and second source/drain regions conductive.

21. The method of claim 10 wherein said step of forming a second insulator layer comprises the steps of:

forming a mask outwardly from portions of the outer surface of the substrate and gate conductor body;

forming a second insulator layer outwardly from said portions of the outer surface of the substrate and the gate conductor resulting in a thickened insulator region disposed between an end portion of the gate conductor and the outer surface of the substrate.

22. The method of claim 10 wherein said step of depositing a layer of conductive material comprises the step of:

depositing a layer of polycrystalline semiconductor material doped to be rendered conductive.

23. The method of claim 10 wherein said step of depositing a layer of conductive material comprises the step of:

depositing a layer of amorphous semiconductor material doped to be rendered conducive.

24. The method of claim 10, wherein said step of etching the layer of conductive material comprises the step of:

etching the layer of conductive material so as to form a gate conductor body using an etchant having selectivity to oxide.

25. The method of claim 10 wherein said step of etching the first insulator layer comprises the step of:

etching the first insulator layer using an isotropic etch selective to the semiconductor material comprising the substrate to expose portions of the outer surface of the substrate and to expose outer surfaces and selected portions of the inner surface of the gate conductor body.

26. The method of claim 10 wherein step of forming a second insulator layer comprises the step of:

growing an oxide material layer outwardly from the outer surface of the substrate and from the gate conductor body resulting in a thickened insulator region disposed between an end portion of the gate conductor body and the outer surface of the substrate.

27. The method of claim 10 wherein said step of forming a first insulator layer comprises the step of:

growing an oxide material outwardly from the outer surface of the substrate.

28. A method for constructing a transistor having reduced hot carrier implantation formed in an outer surface of a semiconductor substrate layer, comprising the steps of:

forming a first insulator layer on the outer surface of the semiconductor substrate;

forming a gate conductor on the first insulator layer;

removing the portion of the first insulator layer not covered by the gate conductor and a portion of the first insulator layer covered by the gate conductor and adjacent the periphery of the gate conductor;

after said removing step, forming a second insulator layer on a first portion of the semiconductor substrate and on a first portion of the gate conductor;

forming a third insulator layer on a second portion of the semiconductor substrate and on a second portion of the gate conductor not covered by the second insulator layer, the third insulator layer outwardly deforming the portion of the gate conductor that it is formed on;

after forming said third insulator layer, removing said second insulator layer and any portion of said third insulator layer on top of the gate conductor and removing said third insulator layer on the semiconductor substrate spaced a distance from the gate; and after removing the portions of the third insulator layer, forming first and second source/drain regions in the outer surface and adjacent the gate insulator layer, said first and second source/drain regions being space apart to define a channel region therebetween.

* * * * *